United States Patent
Schmid et al.

(10) Patent No.: US 10,175,089 B2
(45) Date of Patent: Jan. 8, 2019

(54) METHOD FOR MONITORING A MEASURING DEVICE OF AUTOMATION TECHNOLOGY

(71) Applicant: Endress + Hauser Flowtec AG, Reinach (CH)

(72) Inventors: Hanspeter Schmid, Kuttigen (CH); Werner Tanner, Gelterkinden (CH); Dirk Sutterlin, Schopfheim (DE); Martin Koch, Dornach (CH)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 15/022,242

(22) PCT Filed: Aug. 12, 2014

(86) PCT No.: PCT/EP2014/067228
§ 371 (c)(1),
(2) Date: Mar. 16, 2016

(87) PCT Pub. No.: WO2015/039814
PCT Pub. Date: Mar. 26, 2015

(65) Prior Publication Data
US 2016/0231162 A1    Aug. 11, 2016

(30) Foreign Application Priority Data
Sep. 17, 2013  (DE) .................... 10 2013 110 243

(51) Int. Cl.
*G01F 25/00* (2006.01)
*G01F 1/32* (2006.01)
(Continued)

(52) U.S. Cl.
CPC .......... *G01F 25/0007* (2013.01); *G01F 1/329* (2013.01); *G01F 1/3218* (2013.01); *G01R 31/028* (2013.01); *G01R 31/2829* (2013.01)

(58) Field of Classification Search
CPC .... G01F 25/0007; G01F 1/329; G01F 1/3218; G01R 31/028; G01R 31/2829
(Continued)

(56) References Cited

U.S. PATENT DOCUMENTS

| 4,459,541 A | 7/1984 | Fielden |
| 5,627,304 A | 5/1997 | Jacob |

(Continued)

FOREIGN PATENT DOCUMENTS

| DE | 3143114 A1 | 7/1982 |
| DE | 10142169 A1 | 3/2003 |

(Continued)

OTHER PUBLICATIONS

German Search Report, German PTO, Munich, dated Feb. 4, 2014.
(Continued)

*Primary Examiner* — Robert R Raevis
(74) *Attorney, Agent, or Firm* — Bacon & Thomas, PLLC

(57) ABSTRACT

A method for monitoring a measuring device of automation technology, wherein the measuring device has a capacitive sensor the sensor has at least one capacitor, and the at least one capacitor is applied for determining or monitoring a process variable. A loss resistance of the at least one capacitor is measured by determining the charge state of the at least one capacitor at a first point in time and at a subsequent, second point in time, and, based on a change of the charge state between the first point in time and the second point in time, information is won concerning disturbance of the ability of the measuring device to function.

10 Claims, 5 Drawing Sheets

(51) Int. Cl.
*G01R 31/02* (2006.01)
*G01R 31/28* (2006.01)

(58) Field of Classification Search
USPC .............. 73/1.25, 780, 862.626, 304 C, 724;
361/280–286; 324/750.3, 686
See application file for complete search history.

(56) References Cited

U.S. PATENT DOCUMENTS

| | | | |
|---|---|---|---|
| 7,886,614 B2 | 2/2011 | Koudal | |
| 7,949,495 B2 | 5/2011 | Wiklund | |
| 8,461,849 B1 * | 6/2013 | Almonte | G01R 31/016 |
| | | | 324/548 |
| 2003/0020486 A1 * | 1/2003 | Tsuchiya | G01R 27/025 |
| | | | 324/548 |
| 2008/0197861 A1 | 8/2008 | Grosjean | |
| 2013/0003429 A1 * | 1/2013 | Murahashi | B60L 3/0046 |
| | | | 363/56.01 |
| 2013/0282309 A1 | 10/2013 | Hollmach | |

FOREIGN PATENT DOCUMENTS

| | | |
|---|---|---|
| DE | 102010064278 A1 | 6/2012 |
| WO | 33027684 A2 | 4/2003 |
| WO | 2007021419 A1 | 2/2007 |
| WO | 2009135764 A1 | 11/2009 |

OTHER PUBLICATIONS

International Search Report, EPO, The Netherlands, dated Oct. 13, 2014.
English Translation of the International Preliminary Report on Patentability, WIPO, Geneva, CH, dated Mar. 31, 2016.

* cited by examiner

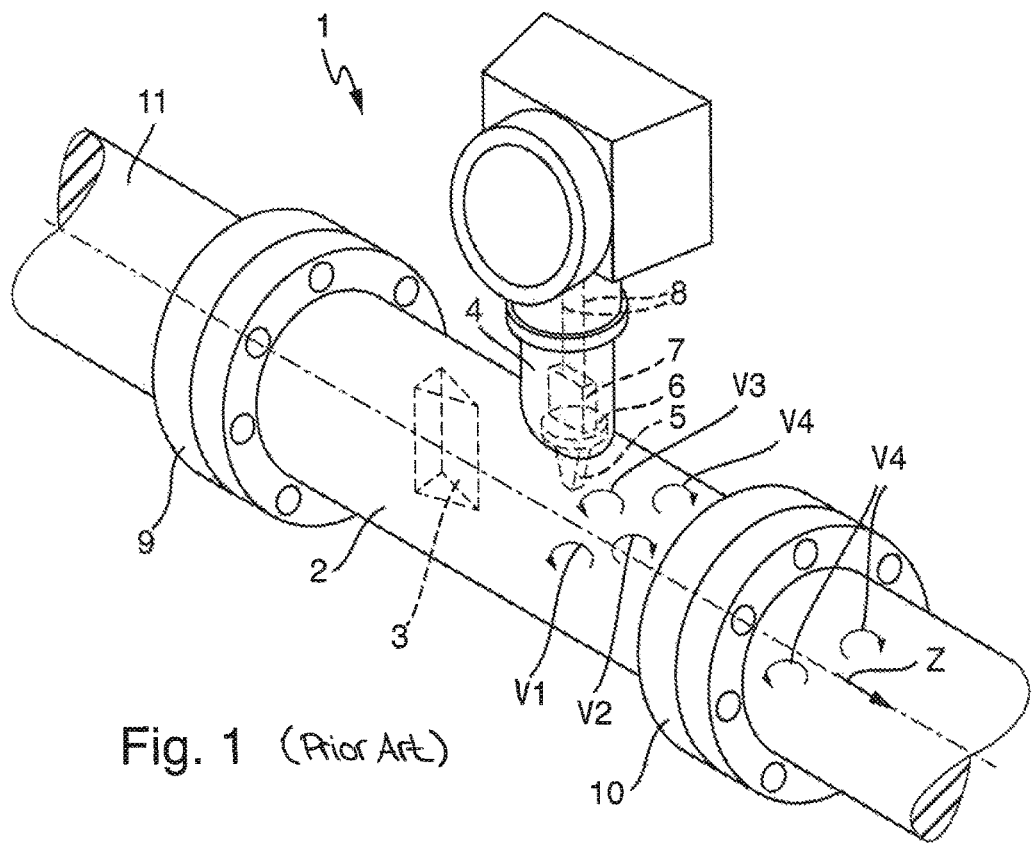
Fig. 1 (Prior Art)
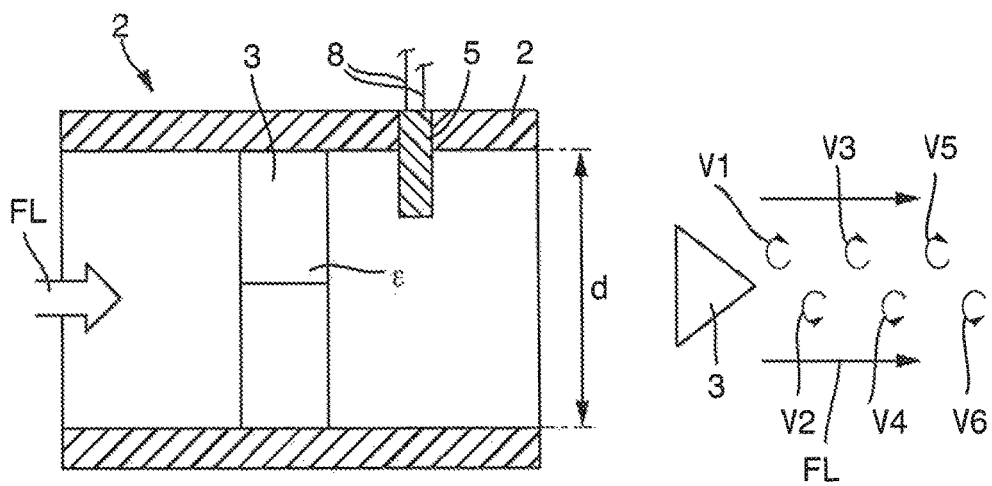
Fig. 2 (Prior Art)　　　　Fig. 3 (StdT.)

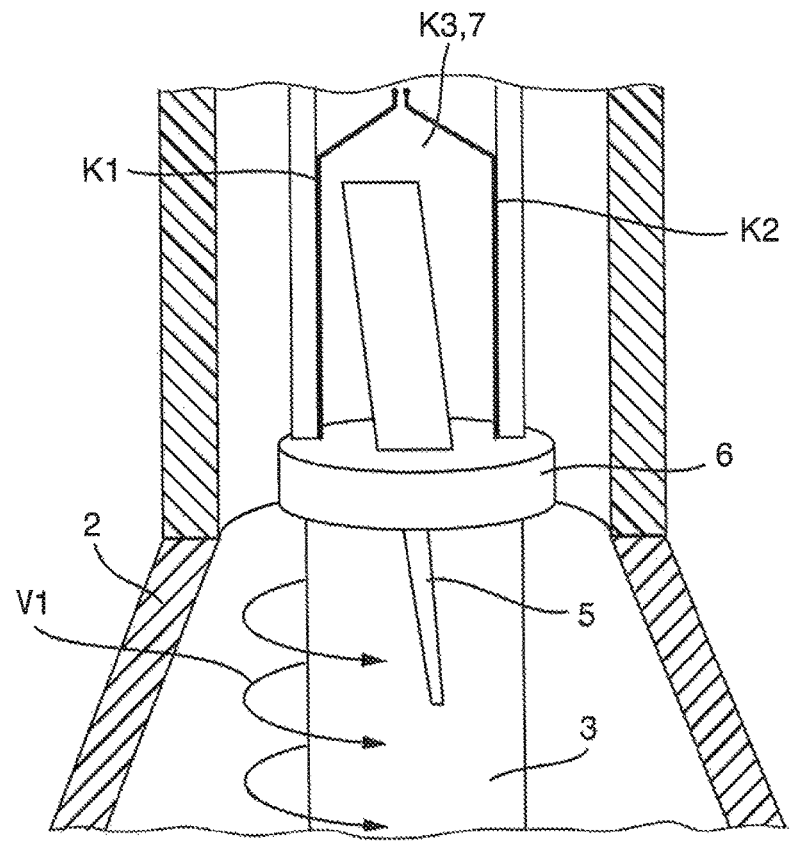
Fig. 4 (Prior Art)
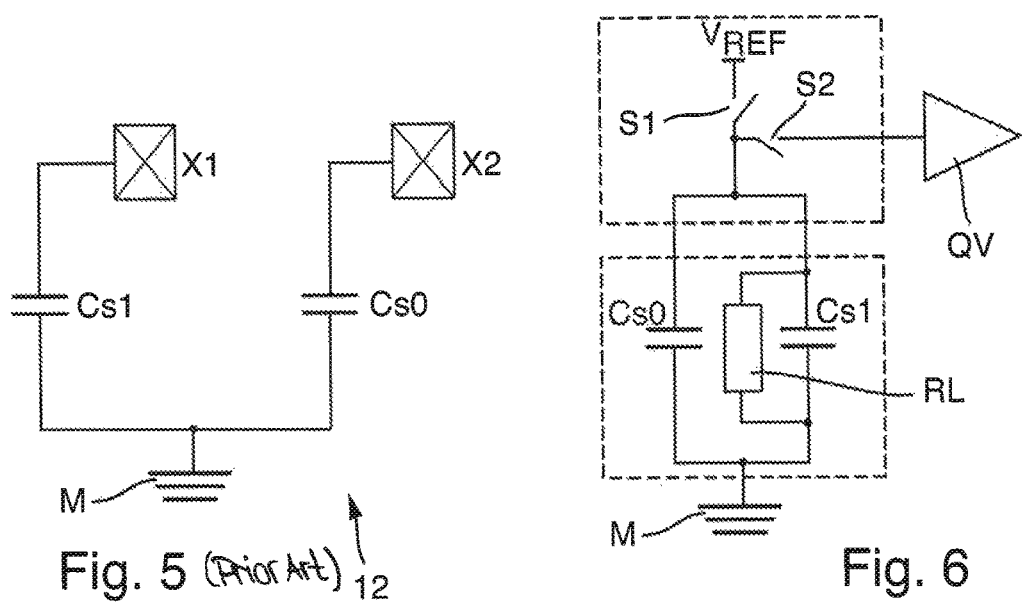
Fig. 5 (Prior Art)
Fig. 6

METHOD FOR MONITORING A MEASURING DEVICE OF AUTOMATION TECHNOLOGY

TECHNICAL FIELD

The invention relates to a method for monitoring a measuring device of automation technology, wherein the measuring device has a capacitive sensor, wherein the capacitive sensor has at least one capacitor, and wherein the at least one capacitor is applied for determining or monitoring a process variable. Furthermore, the invention relates to an apparatus for performing the method for monitoring ability of the measuring device to function.

BACKGROUND DISCUSSION

In process and automation technology, field devices are often applied, which serve for registering and/or influencing process variables. Serving for registering process variables are measuring devices, such as, for example, fill level measuring devices, flow measuring devices, pressure- and temperature measuring devices, pH-measuring devices, conductivity measuring devices, etc., which register corresponding process variables, fill level, flow, pressure, temperature, pH value, and conductivity, respectively. Used for influencing process variables are actuators, such as valves or pumps, via which e.g. the flow of a liquid in a pipeline or the fill level of a medium in a container can be changed. Referred to as field devices are, in principle, all devices, which are applied near to the process and which deliver, or process, process relevant information. A large number of such field devices are available from members of the firm, Endress+Hauser. In connection with the invention, the terminology, field device, thus includes all types of measuring devices and actuators. Furthermore, the terminology, field device includes also e.g. a gateway, a radio adapter or other bus participants integrated/integrable in a bus system.

Rough conditions of use reign in many industrial plants, so that field devices can experience very high loads. During the planning of an industrial plant, the loadability of the field devices, which are to be applied, should be carefully considered. Main concerns, in such case, are not only the durability of the field devices per se, but, instead, also the reliability and the functional ability of the measurements technology integrated in the field devices. Themes such as lifetime, self monitoring and predictive maintenance play an important role here. These considerations hold especially for measuring devices applied for registering process variables.

Vortex flow measuring devices are applied, for example, in order to register the flow velocity of a medium in a measuring tube. In order to prevent negative outcomes, the measurements technology applied in vortex, flow measuring devices must deliver reliable measured values and be failsafe. In plants, in which actuators influence the same or another process variable based on process variables registered by measuring devices, considerable damage can result, when the actuators work based on unreliable measured values. In this sense, vortex flow measuring devices must not only function, but also work reliably, especially also in plants, such as, for example, a steam power plant, in which the lines are partially high pressure lines, especially such lines containing media heated to high temperatures.

The example of a vortex, flow measuring device will be developed further in the following. Vortex flow measuring devices are in the normal case composed of a measuring tube having a bluff body arranged in the measuring tube. Vortices form in media flowing past this bluff body, provided that the media, respectively the flows of the media, fulfill certain conditions.

Playing an important role in this connection is the Reynolds number. The Reynolds number is a dimensionless variable, which characterizes the ratio between inertial forces and viscosity forces of a flow system. When the Reynolds number of a system lies in a certain region, vortices are formed in the medium flowing past the bluff body in the measuring tube. The vortices are such that they form a so-called Kármán vortex street. The vortices are shed alternately from the surface of a first side of the bluff body and from the surface of a second side of the bluff body. The vortices have different rotational directions as a function of the side on which they are shed. The vortices are always shed with equal separation from one another. This means that the vortex shedding frequency is influenced only by a change of the flow velocity of the flowing medium. The vortex shedding frequency is thus directly dependent on the flow velocity.

Measuring devices, which register the vortex shedding frequency, have a sensor system, respectively measurements technology, which registers the pressure fluctuation as a result of vortex formation. Known is a sensor system, which has a capacitive sensor and a paddle. The paddle protrudes into the measuring tube and is moved from one side to the other under the influence of the vortices. The lateral movements are registered via a capacitance change. At least one capacitor is arranged in a chamber for registering the capacitance changes, wherein the chamber is sealed from the process. The movement of the paddle is transferred to a movable element within this chamber via a membrane, or diaphragm. The membrane serves for sealing the space from the process as well as for recording the process pressure.

Measuring devices for registering process variables are frequently equipped with seals. The seals serve to block from the electrical, electronic or also mechanical components of the measuring device moisture originating from the process and/or the environment. If a seal is defective, moisture can strongly influence the ability of the measuring device to function. For example, a membrane in a vortex flow measuring device can in the case of high loading break open, or small cracks can form in the membrane. Thus, in an automated plant, the case can occur that a valve in the plant opens or closes too rapidly. As a result of thereof, a pressure wave forms in a pipeline, which can cause considerable damage. Among other things, the membrane of a vortex flow measuring device can be damaged, wherein the damage can involve small openings/cracks, so that medium can penetrate therethrough into the interior. The penetrating moisture can cause short circuits in the electrical and/or electronic components, or over longer periods of time result in corrosion.

Leakage electrical current, which flows between a measuring device electronics and a grounded measuring device housing, can be monitored, in order to detect a defective operating state of a measuring device. For example, known from Published International Application WO 2009/135764 A1 is a method for monitoring a measuring device, especially a measuring device formed as a measuring- and/or switch device of industrial measuring- and automation technology and/or an electronic measuring device. In the case of the known solution, a potential difference is produced between the housing and the measuring device electronics for effecting a leakage current, wherein the leakage current flows through an electrically conductive connection between the housing and the measuring device electronics formed by condensed water. Furthermore, the flowing leakage current is registered, and a digital state value is generated taking into consideration the registered leakage current. Then, an alarm signal is generated, which signals the occurrence of a failure in the measuring device—especially a failure caused by the undesired formation of conductive deposits within the housing.

Disadvantageous in the case of the known method is that an electrical current measuring circuit is required for registering the leakage current. It is further in this method only measured whether instantaneously an electrically conductive connection is present or not. The method registers a failure only in the case of a leakage current flowing to ground. Predictive maintenance is not possible with the known solution.

Known from US 2013/0207677 A1 is a method for detecting a malfunction of an electrostatic, capacitive sensor, wherein the method includes steps as follows:

- detecting a first detection signal as a function of an electrostatic capacitance, which is ascertained via a detection electrode, when a first electrical voltage is placed on a shield electrode, which is provided in the vicinity of the detection electrode;
- detecting a second detection signal as a function of an electrostatic capacitance, which is ascertained via the detection electrode, when a second electrical voltage different from the first voltage is placed on the shield electrode; and
- determining due to the first acertainment signal and the second acertainment signal, whether a disturbance of the detection electrode is present.

A disadvantage of the above described solution is that an additional detection electrode is provided. Additionally, at least two different reference voltages are required.

SUMMARY OF THE INVENTION

An object of the invention is to provide a method and an apparatus, which monitor the ability of a measuring device of automation technology to function, without requiring additional components.

The object is achieved by a method for monitoring a measuring device of automation technology, wherein the measuring device has a capacitive sensor, wherein the sensor has at least one capacitor, and wherein the at least one capacitor is applied for determining or monitoring a process variable, characterized in that loss resistance of the at least one capacitor is measured by determining the charge state of the at least one capacitor at a first point in time and at a subsequent, second point in time, and, based on a change of the charge state between the first point in time and the second point in time, information is won concerning disturbance of the ability of the measuring device to function. The charge state of the at least one capacitor can be characterized via different variables. Thus, the charge state can be characterized at least by the charge on the capacitor and/or the voltage across the capacitor. The change of the charge state is accordingly determinable in different ways. The loss resistance is the resistance via the path, via which a leakage current of the capacitor flows, wherein a leakage current is an electrical current, which flows via a path, which is not provided for the conduction of electrical current. The information concerning a disturbance can have different aspects. From this information, both the occurrence of a disturbance can be recognized, as well as also a tendency ascertained, which lessens the functional ability of the sensor.

The method is preferably applied in the case of a measuring device, which has a capacitive sensor. Then the method can be executed with the existing components. A vortex flow measuring device includes, for example, both at least one capacitor, as well as also the corresponding electronics necessary for practicing the method. The method further enables a targeted monitoring of the at least one capacitor, wherein the at least one capacitor is monitored either at defined points in time and/or during a defined period of time.

An advantageous further development of the method of the invention provides that a digital diagnostic value for representing the change of the charge state of the at least one capacitor is ascertained, information concerning the disturbance of the ability of the measuring device to function is won by comparing the diagnostic value with a predetermined threshold value, and a failure report is generated, when the predetermined threshold value is exceeded. The digital diagnostic value can be ascertained, for example, in an evaluation unit, by forming the quotient of the charge states at the two sequential points in time. An evaluation unit provides many options for ascertaining a digital diagnostic value.

The change of the charge state suggests in the normal case a decline of the loss resistance value. The threshold value can be, for example, a value, which is device specifically determined or set according to the requirements of a safety standard. Especially, the threshold value represents a minimum permitted value of the loss resistance. An exceeding of this threshold value indicates a loss resistance, which is too low. The generated failure report can serve as an indication of a disturbance and/or as an early maintenance suggestion. Such failure reports, as a rule, save much time and money.

An advantageous further development of the method of the invention provides that the difference in the charge states of the capacitor is determined at the two sequential points in time, and the information concerning a disturbance of the ability of the measuring device to function is won from the difference.

The determining of the difference can occur in analog form. Thus, a fast and simple opportunity is to register the change of the charge states as a difference, wherein in this case there is also the advantage that a charge injection is canceled or eliminated by the subtracting. Charge injection can occur due to stray capacities or disturbance pulses, which arise, for example, in circuits with analog and digital components.

In an advantageous further development, a digital difference value representing the difference between the charge states is ascertained, and the information concerning a disturbance of the ability of the measuring device to function is won by comparing the difference value with a predetermined threshold value. A failure report is generated when the predetermined threshold value is exceeded.

The difference between the states of charge suggests in the normal case a lowering of the loss resistance value. The threshold value can be, for example, a value, which is device specifically determined or set according to the requirements of a safety standard. Especially, the threshold value represents a minimum permitted value of the loss resistance. An exceeding of this threshold value indicate a loss resistance, which is too low. The generated failure report can serve as a direct warning and/or as an early maintenance suggestion. For example, in the case of a measuring device, which would function reliably for a long time with a capacitor loss resistance of 30 MΩ, a failure report can be output, when, for example, the loss resistance falls below 50 MΩ. As a rule, such failure reports save costs and much time and can even be lifesaving.

An advantageous further development of the method of the invention provides that the loss resistance of the at least one capacitor is measured by charging the at least one capacitor a first time with a reference voltage, the charge on the at least one capacitor is determined after a first predetermined time span, the at least one capacitor is charged a second time with the reference voltage, and the charge on the at least one capacitor is determined after a second predetermined time span, and the first and second predetermined time spans are differently long.

The reference voltage is output from a reference voltage source, wherein reference voltage sources count as fixed components of a field device, since these are required, for example, in order to perform the normal tasks of a measuring device. During the time spans, the at least one capacitor discharges. The first and second predetermined time spans are differently long, so that the at least one capacitor can discharge for differently long periods of time. Thus, distinguishing charges are determined for the first and second points in time, for the discharge occurs differently rapidly as a function of the previously described loss resistance. The discharging of a capacitor is characterized by means of the so-called RC time constant. The derivation of the RC time constant and the physical principles, on which the method of the invention rests, are well known to those skilled in the art.

In the case of this measuring of the loss resistance, it plays no role, whether the leakage current flows to ground or via a short circuit to another component of the measuring device, because only the charge on the at least one capacitor is measured. The path that the lost charge takes is insignificant. In the same way, it is insignificant for the measurement reliability, where the charge flows to. For measurement reliability, it is only important that the at least one capacitor can store a predetermined amount of charge over a predetermined time span.

In an advantageous further development, the second predetermined time span is shorter than the first predetermined time span, so that the corresponding second point in time, at which the determining of the charge state of the at least one capacitor is performed, occurs directly after the second charging of the at least one capacitor.

The terminology, directly, is best understood in this context in connection with a so-called system clock of the sensor system. Measuring devices, which apply a capacitor, in order to determine a process variable, can function in two different ways. Either the capacitance of a capacitor is continuously observed, or it is registered in a discrete manner. As an example of this discrete manner, a capacitor is charged, discharged and recharged, wherein the determining of the instantaneous capacitance of the capacitor occurs in connection with the discharging. The capacitance of a capacitor can be continuously observed by connecting the capacitor to a high frequency electrical current circuit.

The invention is especially advantageous, when the capacitance is registered in a discrete manner. In this context, a system clock signal is applied, in order to coordinate the charging and discharging of the at least one capacitor. That the second determining takes place "directly" after the second charging of the at least one capacitor means then in connection with the invention that it occurs within a period of time, which is defined or definable by a low number of clock pulses. A low number means, for example, 5 clock pulses, or especially 1 clock pulse. The system clock pulses a measuring device with a specific frequency.

If, for example, the system clock runs at a frequency of 125 kHz, then a clock pulse occurs every 8 µs. If, for example, the at least one capacitor is charged with a clock signal, then it is connected to the reference voltage source for 8 µs. If "directly after the second charging of the at least one capacitor" is defined by the low number of especially 5 pulses, it takes a maximum of 40 µs after the capacitor is charged a second time until the charge state is determined.

When the second determining of the charge state of the at least one capacitor occurs directly after the second charging, such has the advantage that no additional memory unit is needed, in order in the meantime to store the result of the first determining.

In an advantageous further development, the first charge, which is determined on the at least one capacitor at the first point in time, as well as the second charge, which is determined on the at least one capacitor at the second point in time, are transferred to a charge measuring capacitor, and the first and second charges subtracted, so that, in such case, a difference between the charge states is electronically ascertained.

The two charges of the capacitive sensor can be transmitted to a charge measuring capacitor, for example, by means of a charge amplifier circuit, and subtracted. A charge amplifier circuit is a simple integrable component, which in many cases is already provided as a component of a measuring device.

An advantageous further development of the method of the invention provides that the at least one capacitor is charged with an exactly determined electrical charge by means of a charge pump.

The charge pump fulfills the same function as a reference voltage and enables an exact determining of the charge loaded onto the capacitor. Different embodiments of charge pumps exist and are known to those skilled in the art.

The application of a charge pump further enables application of the method of the invention also in the case, in which the total capacitance changes between the first and second points in time of the method.

An advantageous further development of the method of the invention provides that a charge state value for representing the charge state of the capacitor is ascertained and that the charge state value for the first point in time is compared with a first predetermined limit value or that for the second point in time is compared with a second predetermined limit value, and from this comparison the information is won concerning disturbance of the ability of the measuring device to function.

It can occur that loss resistance of the at least one capacitor is low enough that the charge status need be determined only once, in order to detect that the ability of capacitor to function is disturbed. For this case, a charge state value is ascertained and compared with a limit value. This limit value is fixed with reference to the corresponding capacitor embodiment, in the case of which it is used. In the case of application of a previously described charge pump, it is possible to establish the limit value independently of the measuring-device-specific embodiment.

This further development is especially advantageous in the case, in which a short circuit arises across the at least one capacitor. A short circuit means here nothing other than that the loss resistance has a very small value. In this case, it can occur that the change of the charge state between the first point in time and the second point in time is hardly noticeable, even though the loss resistance is very low. This can result from a too fast discharging of the at least one capacitor, so that the two determinations of the charge state occur at points in time, in which the discharge has already largely occurred. A range of loss resistances, in the case of which this principle appears, respectively in the case of which this further development brings special advantages, is established based on measuring device specific variables, such as, for example, the RC time constant.

An advantageous further development of the method of the invention provides that loss resistance of the at least one capacitor is plotted as a function of time, and based on a falling trend of the loss resistance versus time a predictive maintenance report is triggered. Loss resistance values, which represent the measured loss resistance, can be graphically displayed as a function of time, for example, by means of an evaluation unit and a display unit.

Information as regards a remaining time can be output by means of an estimating function, wherein the remaining time characterizes the remaining lifetime, respectively the remaining time, until the at least one capacitor can no longer reliably determine and monitor a process variable. The estimating function can generate the information, for example, based on extrapolation of a curve, which is fitted to the loss resistance values.

In industrial plants, the time necessary for replacing a measuring device can bring about considerable costs. A predictive maintenance report enables a minimizing of such costs. For example, based on the predictive maintenance report in a plant, in which a number of measuring devices are installed, two or more measuring devices can be simultaneously replaced or repaired.

The object is also achieved by an apparatus for performing the method for monitoring the ability of a measuring device to function, characterized in that the measuring device is a vortex flow measuring device having a measuring tube, a bluff body arranged in the measuring tube for producing vortices, associated with the bluff body a capacitive sensor, which registers by means of the at least one capacitor the vortex shedding frequency of a Kármán vortex street produced by the bluff body, and a control/evaluation unit, which determines the process variable and generates the information concerning a disturbance of the ability of the measuring device to function.

In an advantageous further development of the apparatus of the invention, the control/evaluation unit conducts measuring of the loss resistance of the at least one capacitor in such a manner that the time between the beginning of the charging process and the second point in time of the charging process amounts to less than half of the vortex shedding period. The charging process begins at a point in time when the at least one capacitor is first charged with a reference voltage.

The capacitive sensor of the vortex flow measuring device functions in the above described manner, wherein the sensor has a paddle and the paddle moves back and forth due to pressure changes. While the paddle moves, charging and discharging occur continuously in the normal measurement process. In such case, the capacitance of the at least one capacitor is regularly checked. When the vortex shedding frequency stabilizes over time, the changes of capacitance assume a periodic character, since the paddle moves regularly back and forth. In principle, in order to register the vortex shedding frequency, the capacitive sensor must only test how often the at least one capacitor has a certain capacitance. If there is thus a regular registering of a recurring point in the periodic changes of the capacitance, then this is sufficient to determine the vortex shedding frequency. In connection with the invention, the terminology "zero crossing" refers to this occurrence. Thus, the zero crossings are counted, in order to determine the vortex shedding frequency.

The normal measurement process of the capacitive sensor cannot occur from the beginning of the charging process until the second point in time, when the charge state of the at least one capacitor is determined. Therefore, the further development is especially advantageous, for it enables performing the method of the invention, without introducing error into the actual measuring function of measuring device.

An advantageous further development of the apparatus of the invention provides that the measuring device has a circuit arrangement with two capacitors, which connect to a shared node or a shared electrode, wherein the shared node or the shared electrode is connected to ground, the capacitors are connected to a reference voltage source via a first switch element, and the capacitors are connected to a charge amplifier via a second switch element.

In a further development, the charge amplifier is integrated in an ASIC circuit.

In a further development, the ASIC circuit includes an analog/digital converter, which is connected to the charge amplifier, and the analog/digital converter is connected to a microcontroller or signal processor serving as evaluating unit.

BRIEF DESCRIPTION OF THE DRAWINGS

The invention will now be explained in greater detail based on the appended drawing, the figures of which show as follows:

FIG. 1 is a vortex flow measuring device known from the state of the art;

FIG. 2 is a longitudinal section through the measuring tube of a vortex flow measuring device;

FIG. 3 is the vortices, which form behind the bluff body, and their rotational directions;

FIG. 4 is a perspective view of the measuring device corresponding to the line of sight Z of FIG. 1;

FIG. 5 is a representative circuit diagram for the measuring device 1 shown in FIG. 4;

FIG. 6 is a circuit diagram of the input circuit 12 of the vortex flow measuring;

DETAILED DISCUSSION IN CONJUNCTION WITH THE DRAWINGS

Figure 7:
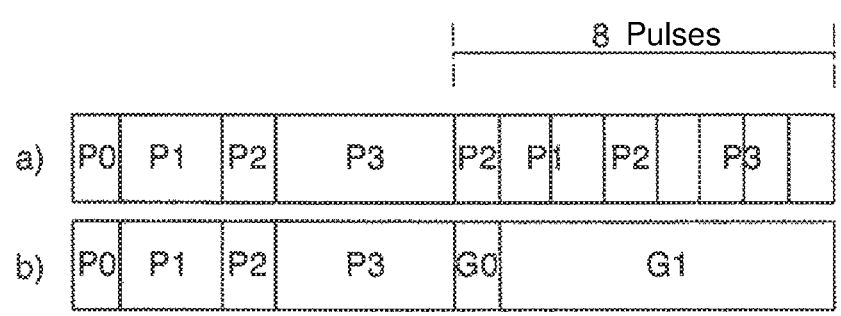
FIGS. 7a-7b are phase diagrams of a normal measurement process and a total capacitance measurement process.

FIG. 1 shows a vortex flow measuring device 1. Measuring device 1 includes a measuring tube 2, a bluff body 3 and a capacitive sensor 4. The sensor 4 includes a paddle 5, which protrudes inwardly into the measuring tube 2. The paddle 5 is coupled to a membrane 6. This membrane 6 serves to seal off the measuring tube 2, so that it is hermetically sealed/pressure tight. The sensor 4 further includes two electrical wires 8, which are connected to two capacitor electrodes K1, K2, wherein the capacitor electrodes K1, K2 are not shown in FIG. 1. The (not shown) capacitor electrodes K1, K2 form two capacitors Cs1, Cs0, which have a shared third electrode K3, 7. The third capacitor electrode K3 is also coupled to the membrane 6. Usually, the three features, paddle 5, membrane 6 and the third electrode K3, 7 are all of the same electrically conductive material. Measuring tube 2 is inserted into a pipe 11 in a plant by means of first and second flange connections 9, 10.

Further shown in FIG. 1 are vortices V1, V2, V3, V4. Vortices V1, V2, V3, V4 are formed in the medium flowing through the measuring tube. The medium flows from left to right. When the medium flows past the bluff body 3, the vortices V1, V2, V3, V4 are alternately shed from the surface of the bluff body 3. Vortex V1, which lies closest to the bluff body 3, was just shed from the rear side of the bluff body. An arrow shows the rotational direction of vortex V1. The three additional illustrated vortices V2, V3, V4 have alternately oppositely sensed rotational directions. These are correspondingly shed from different sides of the bluff body 3.

FIG. 2 shows a longitudinal section of the measuring tube 2 of a vortex flow measuring device. As in FIG. 1, the medium flows past the bluff body 3 from left to right. Likewise shown are the paddle 5 and the two electrical wires 8.

Media flowing through the measuring tube 2 are described via the Reynolds number. The Reynolds number is a dimensionless number, whose derivation from the Navier-Stokes equation is known to those skilled in the art. In the measuring tube 2 illustrated in FIG. 2, the Reynolds number is calculated for a flowing medium with the assistance of the following equation:

$$Re = (\rho * V * d)/\eta$$

In such case:
$\rho$ is the characteristic density of the medium in kilogram per cubic meter,
V the characteristic flow velocity of the medium in the measuring tube 2 in meters per second;
d the inner diameter of the measuring tube 2 in meters; and
$\eta$ the characteristic dynamic viscosity of the medium in kilogram per second per meter;.

Vortices shed from the bluff body 3 over a large range of Reynolds numbers, for example, between 47 and 10^7. The shedding frequency f can be calculated from the equation:

$$Sr = (f * \xi)/V,$$

wherein:
f is the vortex shedding frequency in hertz,
$\xi$ a characteristic dimension of the bluff body 3 in meters,
V the characteristic flow velocity of the medium in the measuring tube 2 in meters per second; and Sr the Strouhal number, wherein the Strouhal number correlates with the Reynolds number for a specified geometry. This correlation is experimentally determined and has, most often, the form:
Sr=m [1−(n/Re)], wherein m and n real numbers are. For example:
Sr=0.198*[1−(19.7/Re)] for 250<Re<2×10^5, wherein the accuracy of the experimentally determined correlation always plays a role.

Used as characteristic dimension of the bluff body 3 is a so-called characteristic width $\xi$. For a cylindrical bluff body 3, this is the diameter of the bluff body 3. FIG. 2 shows a characteristic width $\xi$ by way of example as the diameter d.

When the Reynolds number lies in a certain region, vortices V are shed from the bluff body 3 with a certain frequency f, wherein $$f = Sr * (V/\xi).$$

The frequency f is registered by a capacitive sensor 4. In FIG. 2, the paddle 5 and the capacitive sensor 4 sit directly behind the bluff body 3. The vortices V1-V4 shed by the bluff body 3 exert forces on the paddle 5, and bring about, in such case, slight fluctuations.

The vortices V1-V6 and their rotational directions are shown in FIG. 3.

FIG. 4 shows a perspective view of the measuring device from the line of sight Z of FIG. 1. Shown are the two capacitor electrodes K1, K2 and likewise the two associated electrical wires 8. FIG. 4 shows further a vortex V1. The arrows are provided, in order to indicate the rotational direction of the vortex V1. Vortex V1 presses the paddle 5 laterally. In order to illustrate the effect of the pressing forces, the movement of the paddle 5 is shown bigger than actual, i.e. enlarged. In a real measuring device, the movement of the paddle 5 is scarcely noticeable. The movement is forwarded via the membrane 6 to a rod 7, which sits between the first and second electrodes K1, K2 of the capacitors Cs0, Cs1. Rod 7 serves as third electrode K3, wherein rod 7 is shared by the two capacitor electrodes K1, K2. Thus, there are two capacitors Cs1, Cs0. The capacitances of the two capacitors Cs1, Cs0 change with the movement of the rod 7. The vortex shedding frequency f can thus be determined based on the changes of the capacitance.

FIG. 5 shows a representative circuit diagram for the measuring device 1 of FIG. 4. The circuit can be referred to as "input circuit" 12. Input circuit 12 contains a first capacitor Cs1 and a second capacitor Cs2. The two capacitors Cs1, Cs2 have a shared electrode K3, which is connected to ground M. Electrode K3 represents the rod 7 of FIG. 4.

As already described above, a change of the capacitance can be registered in a discrete manner. In FIG. 5, the first capacitor Cs1 has a first connection X1 and the second capacitor Cs0 a second connection X2. Via these two connections X1, X2, the capacitors Cs1, Cs0 are charged with a reference voltage $V_{REF}$ and then discharged for determining the capacitance. The connections X1, X2 can by way of example be connected to an ASIC circuit.

FIG. 6 shows a circuit diagram of the input circuit 12 of the vortex flow measuring device 1. In FIG. 6, the two connections X1, X2 of FIG. 5 are joined. The total capacitance of the two capacitors Cs0, Cs1 remains unchanged. If the two connections X1, X2 are joined, the two capacitors Cs0, Cs1 can be connected together to a reference voltage source $V_{REF}$ via a first switch element S1. As a result, the capacitors can be charged with the reference voltage $V_{REF}$. A loss resistance $R_L$ is shown in FIG. 6. As above described, the loss current path does not represent an intentionally provided electrical current path, but, instead, a path, via which a leakage current flows.

Figure 9:
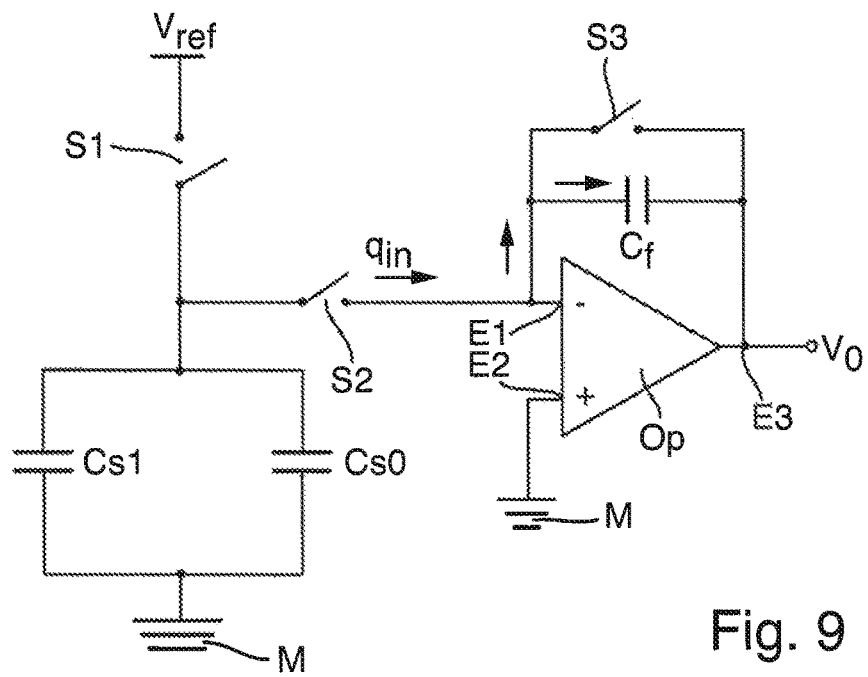
FIG. 9 is a circuit diagram of a preferred form of embodiment of the apparatus for performing the method of the invention.

FIG. 6 shows further a second switch element S2. Via this second switch element S2, the joined connections X1, X2 of the two capacitors Cs0, Cs1 can be connected to a charge amplifier Qv. An embodiment of the charge amplifier Qv is shown in FIG. 9. The functioning of charge amplifier Qv is described in connection with FIG. 9.

In a vortex flow measuring device 1, it is only necessary to determine the vortex shedding frequency f. This can happen in different ways. For example, in a vortex flow measuring device 1 with two capacitors Cs0, Cs1, the zero crossings can be counted. The arrangements of the capacitors Cs0, Cs1, as shown in FIGS. 4 to 6, can be referred to as DSC sensors (i.e. "differential switched capacitor sensors"). A zero crossing occurs when the capacitances of the two electrodes K1, K2 are equal. This happens each time the rod 7 moves from one side to the other as it oscillates. This corresponds, of course, to the movement of the paddle 5 and, furthermore, to the shedding of a vortex from the bluff body 3. Thus, a zero crossing corresponds to a vortex.

An opportunity for detecting a zero crossing exists when, after the two capacitors Cs0, Cs1 are charged, the two connections X1, X2 are connected to a comparator. This example of an embodiment is not shown in the drawing. In such an embodiment, a zero crossing is detected based on a level change in the output signal of the comparator. Such an embodiment has the disadvantage that it is easily disturbable by noise. Furthermore, the midpoint of the rod 7 can drift.

The midpoint of the rod 7 is the rest position of the rod 7 or the position of the rod 7 in absence of pressure forces. The midpoint of the rod 7 corresponds further to the position, at which the capacitances of the capacitors Cs0, Cs1 are equal to one another. It is possible that the capacitances are different at the midpoint of the rod 7. In this case, one speaks of a "static offset".

A second opportunity for counting the zero crossings is based on the measurement process illustrated in FIGS. 7a,b. Shown in FIG. 7a are four blocks, which represent four different phases P0, P1, P2, P3 of the measurement process. The width of each block corresponds to the time, during which its respective phase P0, P1, P2, P3 is running. The four phases P0, P1, P2, P3 are continuously repeated. FIG. 7a shows only one repetition.

In the first phase P0 of the measurement process, the two capacitors Cs0, Cs1 are charged with different voltages. In such case, the first connection X1 is connected to a positive or negative reference voltage $V_{POS}$, $V_{NEG}$, and the second connection X2 is accordingly connected to a negative or positive reference voltage $V_{NEG}$, $V_{POS}$. Thus, the one capacitor Cs0, Cs1 is charged positively and the other capacitor Cs1, Cs0 negatively, wherein the absolute magnitude of the positive and negative reference voltages $V_{POS}$, $V_{NEG}$ are equal.

In the second phase P1, the capacitors Cs0, Cs1 are discharged. During discharging, the charges of the two capacitors Cs0, Cs1 are loaded together onto a charge measuring capacitor $C_f$. Thus, a difference between the capacitances is ascertained. The charges are added on the charge measuring capacitor $C_f$, wherein the charges are opposite. Thus, a first charge difference of the absolute magnitude of the charge is arrived at, which corresponds, furthermore, to a difference of the capacitances.

In the third phase P2, the capacitors Cs0, Cs1 are recharged. The third phase P2 is the opposite of the first phase P0. The capacitor Cs0, Cs1, which was charged in the first phase P0 with a positive charge, is charged with a negative charge in the third phase P2. In the same way, the other capacitor Cs1, Cs0, which was first negatively charged, is positively charged in the third phase P2.

In the fourth phase P3, the capacitors Cs0, Cs1 are once again discharged, and a second charge difference of the absolute magnitude of the charge, which corresponds, furthermore, to a difference of the capacitances, is determined. In the fourth phase P3, furthermore, the first and second charge differences of the second and fourth phases P1, P3 are subtracted from one another. The charge difference of the second phase P1 is a charge, which is opposite to the charge difference of the fourth phase P3. Thus, in the case of a subtraction of the first charge difference from the second charge difference, or likewise the second from the first, an addition of the absolute magnitudes of the two charge differences occurs. This serves to strengthen the measurement signal as well as to suppress or eliminate present disturbance elements, such as charge injection or an offset.

The measurement signal is, of course, recorded and processed further, for example, digitized. Preferably, the normal measurement process runs a number of times within a time interval defined by the reciprocal of the vortex shedding frequency. In other words, the vortex flow measuring device 1 should register a number of charge differences, especially between the points in time, at which a first vortex V2 is shed and a second vortex V1 is shed. Thus, the position of the paddle 5 is determined at many points in time and the zero crossings counted.

An example will now be described. If a vortex flow measuring device 1 with a bluff body 3 having a characteristic width ξ of about 3 mm, should register flow velocities up to 125 m/s, the paddle 5 must be able to register vortex shedding frequencies f over a range from about 1 Hz up to about 4000 Hz. The paddle 5 and membrane 6 must, as a mass, spring system, consequently, have a corresponding resonant frequency greater than 4000 Hz. Furthermore, the normal measurement process should be able to repeat a number of times within a period of time, which amounts to 1/4000 of a second. If the measurement process transpires at least four times in 1/4000 of a second, then a measurement is made every 1/16000 second. As shown in FIG. 7a, one repetition of the measurement process requires at least 8 clock pulses of a system clock. It follows, consequently, that a system clock of at least 128 kHz must be used.

In FIG. 7b, the normal measurement process transpires once. The normal measurement process is thereafter interrupted, and a measurement process for determining the total capacitance of the two capacitors is performed. This measurement process is composed of two phases G0, G1. In the first phase G0, the two connections of the capacitors Cs0, Cs1 are connected together to a reference voltage source $V_{REF}$. The capacitors Cs0, Cs1 are thereby charged to a reference voltage $V_{REF}$. In the second phase G1, the capacitors Cs0, Cs1 are discharged. In such case, the total capacitance of the capacitors Cs0, Cs1 is determined. A total capacitance value or a charge state value for representing the total charge of the capacitors Cs0+Cs1 can then be ascertained and stored. The total capacitance measurement is important not only for detecting a short circuit, such as already described above, but, also for calculating a static offset.

Figure 8:
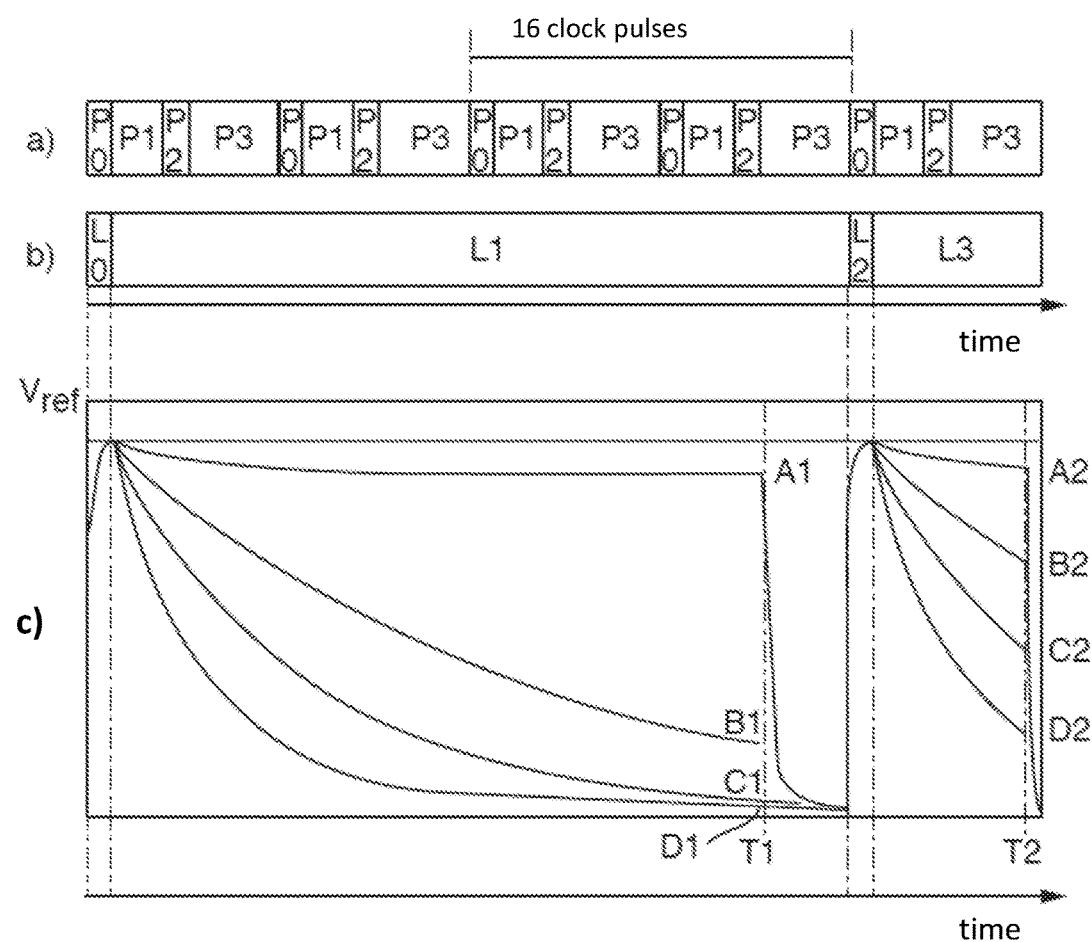
FIGS. 8a-8c are an example of an embodiment of the method of the invention and a graphical representation of voltage across the capacitors as a function of time.

FIGS. 8a and 8b show an example of an embodiment of the method of the invention. In FIG. 8a, the normal measurement process is passed through regularly. FIG. 8b, the normal measurement process is interrupted and replaced by a measurement process for determining a leakage current. This alternate measurement process is composed of four phases L0, L1, L2, L3.

In the first phase L0, in the same manner as in the first phase of the measurement process for determining the total capacitance G0, the two connections X1, X2 of the capacitors Cs0, Cs1 are connected together to a reference voltage source $V_{REF}$ and the capacitors charged thereby to a reference voltage $V_{REF}$.

In the second phase L1, a first time span is firstly allowed to expire. After this first time span, at a first point in time T1, the charge state of the two capacitors is ascertained by discharging the capacitors Cs0, Cs1 by means of a charge amplifier Qv.

In the third phase L2, in exactly the same manner as in the first phase L0, the two connections of the capacitors are connected together to the reference voltage source $V_{REF}$, and the capacitors Cs0, Cs1 thereby charged to the reference voltage $V_{REF}$.

In the fourth phase L3, a second time span is firstly allowed to expire. After this second time span, at a second point in time T2, the charge state of the two capacitors Cs0, Cs1 is ascertained by discharging the capacitors by means of a charge amplifier Qv. The charge state of the second phase L1 and the charge state of the fourth phase L3 are subtracted from one another for forming a difference in a manner similar to the charge difference formation of the last phase of the normal measurement process. Options for discharge and difference forming are described in greater detail in connection with FIG. 9.

FIG. 8c is a graphical representation of the voltage across the capacitors Cs0, Cs1 as a function of time. The time axes in FIGS. 8a-c are the same. The changes of voltage shown in FIG. 8c corresponds, consequently, to the changes, which occur during the measurement process shown in FIG. 8b. Shown in FIG. 8c are four curves A, B, C, D, wherein the curves A, B, C, D represent the voltage changes for four cases. The loss resistance value in the four cases has four different sizes. Curve A shows the case, in which the loss resistance is the greatest, and curve D shows the case, in which the loss resistance is the smallest. FIG. 8c shows the capacitor charging curves for the first and third phases L0, L2 of the measurement process for determining the leakage current. The curves A,B,C,D behave equally, or almost equally, for these phases L0, L2 in the four different cases. These are shown, consequently, with only a single curve.

In the second and fourth phases L1, L3, time spans are allowed to expire. The discharging curve for a capacitor, which is connected in parallel with a resistor/loss resistance, is known to those skilled in the art. The charge Q(t) on the capacitors is:

$$Q(t)=C*V_{REF}*\exp(-t/RC),$$

wherein
C is the capacitance,
$V_{REF}$ the reference voltage,
t the time and
R the loss resistance value.

In FIG. 8c, first of all, at the two points in time T1, T2, the charge states A1, B1, C1, D1 and A2, B2, C2, D2 of the capacitors are determined. By means of the determined charge states, differences of the charge states are registered for the four different cases.

Known to those skilled in the art are various methods for discharging capacitors for determining capacitances, respectively for determining the charge on capacitors or the voltage across capacitors. Likewise many are the options for forming a difference of the charges or voltages equally using analog as well as digital methods. FIG. 9 shows one such opportunity for discharging the capacitors.

FIG. 9 shows a circuit diagram of a preferred form of embodiment of the apparatus for performing the method of the invention. The input circuit 12 is exactly as shown in FIGS. 5 and 6. Input circuit 12 is connected via a second switch S2 with the charge amplifier Qv. The charge amplifier Qv comprises an operational amplifier Op having an inverting input E1 and a non-inverting input E2. The non-inverting input E2 is connected to ground M, to which also the third electrode K3 of the input circuit 12 is connected. The operational amplifier Op further includes an output E3, wherein the output E3 and the inverting input E1 of the operational amplifier Op are connected via a feedback path. The feedback path includes a third switch element S3 as well as a charge measuring capacitor $C_f$ connected in parallel with the third switch element S3.

The circuit of FIG. 9 functions in the following way. The circuit is used in two phases Φ1, Φ2. In the first phase Φ1, the charge measuring capacitor $C_f$ is discharged. This occurs via a simple short circuit via the third switch element S3. In the first phase Φ1, thus the third switch element S3 is closed and then re-opened.

In the second phase Φ2, the second switch element S2 is closed. Because the non-inverting input E2 of the operational amplifier Op lies at ground M, the inverting input E1 lies at a so-called "virtual ground". Consequently, the entire charge, which is stored on the capacitors Cs0, Cs1 of the input circuit 12, is compelled to transfer to the charge measuring capacitor $C_f$. The charge moves, in such case, along the path shown by the arrows. The output voltage $V_O$ of the operational amplifier Op corresponds accordingly to the voltage across the charge measuring capacitor $C_f$, wherein this voltage is directly proportional to the charge, which was transmitted from the input circuit.

A difference of the charge states can be registered by means of this voltage. For example, the voltage from a first passage through these phases Φ1, Φ2 can be placed in a sample, hold circuit and then in the case of a second passage be subtracted from a second voltage. In another example, the voltages can be immediately digitized and then processed by means of an evaluation unit. In an additional example, the charge from the capacitors Cs1, Cs0 can be immediately added or subtracted in the charge measuring capacitor $C_f$, especially when the capacitors Cs1, Cs0 are charged the first time with the positive reference voltage +Vref and the second time with the negative reference voltage −Vref. Those skilled in the art will appreciate that the method of the invention can be executed by means of many types of difference forming.

Figure 10:
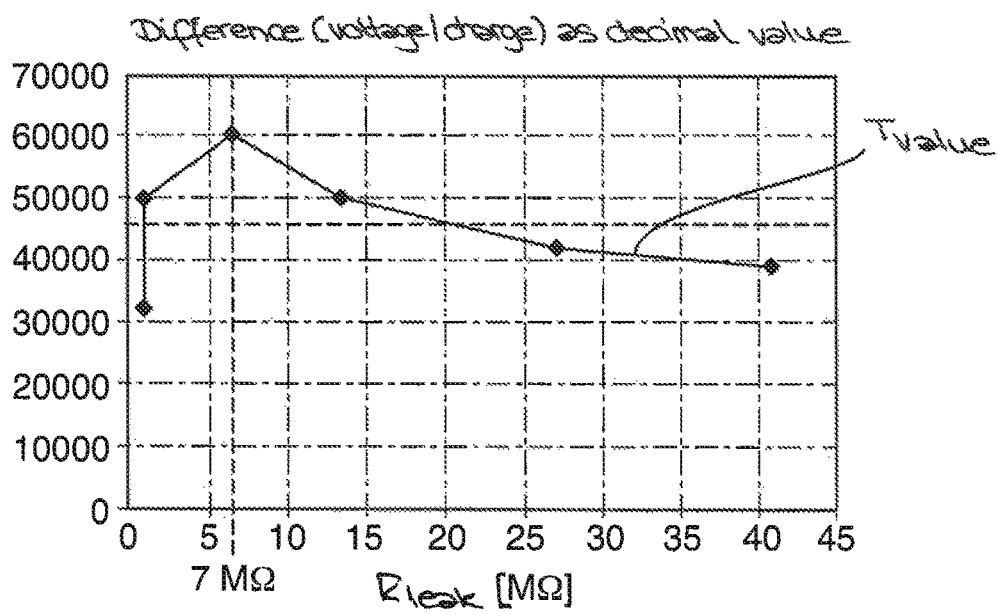
FIG. 10 is a graphical representation of difference as a function of loss resistance.

FIG. 10 shows a graphical representation of a difference curve as a function of loss resistance R[leak], $R_L$. The Y-axis shows, in this case, a decimal value representing the difference value. The difference value is a difference of the voltages of the charge measuring capacitor $C_f$ as well as the magnitude of the charge difference of the sensor capacitors Cs1, Cs0 at the two points in time T1, T2. A decimal value of about 32000 represents in this case no change of the charge state of the capacitors.

In the case of a very low loss resistance $R_L$, the capacitors completely discharge before the first point in time in the second phase L1 and also before the second point in time in the fourth phase L3. There is, in this case, no change to detect. Therefore, the difference value is very low. In the case of a very high loss resistance $R_L$, there is, of course, likewise little change of the charge state. In this graphical presentation, a turning point is provided at 7 MΩ. If the loss resistance lies below 7 MΩ, a difference of the charge state at the two points in time T1, T2 can no longer provide information concerning the ability of the capacitive sensor to function.

The expected change of the charge state of the two capacitors Cs0, Cs1 is given by the following formula:

$$\text{delta } Q(t)=C*Vref*(\exp(-T/RC)-\exp(-kT/RC)),$$
wherein

T corresponds to the shorter time span, and
kT corresponds to the longer time span, wherein the time of the longer time span corresponds to exactly k-times the shorter time span. The time spans T, kT can be interpreted likewise as a pulse T and a number k of pulses kT.

Furthermore, a threshold value $T_{VALUE}$ is shown in FIG. 10, wherein the threshold value is so established that a failure report is output, when the loss resistance falls under 20 MΩ.

The invention claimed is:

1. A method for monitoring a measuring device of automation technology, wherein the measuring device is a vortex flow measuring device having a measuring tube, a bluff body arranged in the measuring tube for producing vortices, and associated with the bluff body a capacitive sensor which registers by means of at least one capacitor a vortex shedding frequency of a Karman vortex street produced by the bluff body, the method comprising the steps of:
   determining or monitoring using the at least one capacitor a process variable, and
   measuring a loss resistance of the at least one capacitor by determining the charge state of the at least one capacitor at a first point in time and at a subsequent, second point in time;
   wherein based on a change of the charge state between the first point in time and the second point in time, information is gathered concerning disturbance of the ability of the measuring device to function.

2. The method as claimed in claim 1, wherein:
   a digital diagnostic value for representing the change of the charge state of the at least one capacitor is ascertained; and
   the information concerning the disturbance of the ability of the measuring device to function is gathered by comparing the diagnostic value with a predetermined threshold value, and a failure report is generated, after the predetermined threshold value has been exceeded.

3. The method as claimed in claim 1, wherein:
   a difference in the charge states of the capacitor at two sequential points in time is determined, and the information concerning a disturbance of the ability of the measuring device to function is gathered from the difference.

4. The method as claimed in claim 3, wherein:
   a digital difference value representing the difference between the charge states is ascertained, the information concerning a disturbance of the ability of the measuring device to function is gathered by comparing the difference value with a predetermined threshold value, and a failure report is generated, when the predetermined threshold value is exceeded.

5. The method as claimed in claim 1, wherein:
   the loss resistance of the at least one capacitor is measured by charging the at least one capacitor a first time with a reference voltage, the charge on the at least one capacitor is determined after a first predetermined time span, the at least one capacitor is charged a second time with the reference voltage; and
   the charge on the at least one capacitor is determined after a second predetermined time span, and the first and second predetermined time spans are differently long.

6. The method as claimed in claim 5, wherein:
   the second predetermined time span is shorter than the first predetermined time span, so that the corresponding second point in time, at which the determining of the charge state of the at least one capacitor is performed, occurs directly after the second charging of the at least one capacitor.

7. The method as claimed in claim 1, wherein:
   the at least one capacitor is charged with an exactly determined electrical charge by means of a charge pump.

8. The method as claimed in claim 1, wherein:
   a charge state value for representing the charge state of the capacitor is ascertained, and the charge state value for the first point in time is compared with a first predetermined limit value or that for the second point in time is compared with a second predetermined limit value; and
   from this comparison the information is gathered concerning disturbance of the ability of the measuring device to function for a case wherein the charge state value underruns the first predetermined limit value or the second predetermined limit value.

9. The method as claimed in claim 1, wherein:
   loss resistance of the at least one capacitor is plotted as a function of time, and based on a falling trend of the loss resistance versus time a predictive maintenance report is triggered.

10. The method as claimed in claim 1, wherein:
   a first charge, which is determined on the at least one capacitor at the first point in time, as well as a second charge, which is determined on the at least one capacitor at the second point in time, are transmitted to a charge measuring capacitor; and
   the first and second charges are subtracted, so that, in such case, a difference between the charge states is electronically ascertained.

* * * * *